(12) United States Patent
Barwicz et al.

(10) Patent No.: US 8,987,693 B2
(45) Date of Patent: Mar. 24, 2015

(54) HIGH DENSITY MEMORY DEVICE

(75) Inventors: Tymon Barwicz, Mount Kisco, NY (US); Keith A. Jenkins, Sleepy Hollow, NY (US); Supratik Guha, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 13/570,390

(22) Filed: Aug. 9, 2012

(65) Prior Publication Data

US 2012/0300534 A1 Nov. 29, 2012

Related U.S. Application Data

(62) Division of application No. 12/729,856, filed on Mar. 23, 2010, now Pat. No. 8,362,477.

(51) Int. Cl.
*H01L 47/00* (2006.01)
*G11C 11/404* (2006.01)
*H01L 49/02* (2006.01)
*G11C 13/00* (2006.01)
*H01L 49/00* (2006.01)

(52) U.S. Cl.
CPC .............. *G11C 11/404* (2013.01); *H01L 28/40* (2013.01); *G11C 13/0007* (2013.01); *H01L 49/003* (2013.01)
USPC .............. 257/2; 257/4; 257/43; 257/E21.078; 257/E45.003

(58) Field of Classification Search
USPC ...................... 257/2, 4, 43, E21.078, E45.003
See application file for complete search history.

(56) References Cited

U.S. PATENT DOCUMENTS

| | | | |
|---|---|---|---|
| 6,987,290 | B2 | 1/2006 | Kim et al. |
| 7,417,271 | B2 | 8/2008 | Genrikh et al. |
| 7,489,492 | B2 | 2/2009 | Kim et al. |
| 2006/0226411 | A1 | 10/2006 | Lee |
| 2008/0048164 | A1 | 2/2008 | Odagawa |
| 2009/0091003 | A1 | 4/2009 | Lim et al. |
| 2011/0008945 | A1 | 1/2011 | Lee et al. |

FOREIGN PATENT DOCUMENTS

| | | |
|---|---|---|
| JP | 2007235139 A | 9/2007 |
| JP | 2008021750 A | 1/2008 |
| WO | 2008062956 A1 | 5/2008 |

OTHER PUBLICATIONS

Byung-Gyu Chae et al., "Abrupt Metal-Insulator transistion Observed in VO2 Thin Films Induced by a Switching Voltage Pulse", Jul. 4, 2005, pp. 1-5.
R.G. Cope et al., "High-Speed Solid-State Thermal Switches Based on Vanadium Dioxide", Brit. J. Appl. Phys. (J. Phys. D), 1968, Ser. 2, vol. 1, pp. 161-168.

*Primary Examiner* — Long Pham
(74) *Attorney, Agent, or Firm* — Cantor Colburn LLP; Vazken Alexanian

(57) ABSTRACT

A method of operating a memory device having a dielectric material layer, a transition metal oxide layer and a set of electrodes each formed over a substrate, includes applying a voltage across the set of electrodes producing an electric field across the transition metal oxide layer enabling the transition metal oxide layer to undergo a metal-insulation transition (MIT) to perform a read or write operation on memory device.

11 Claims, 4 Drawing Sheets

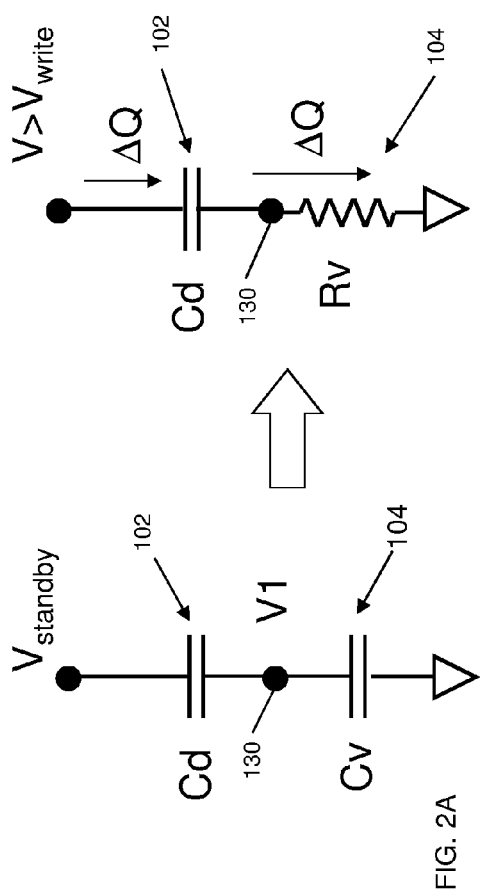
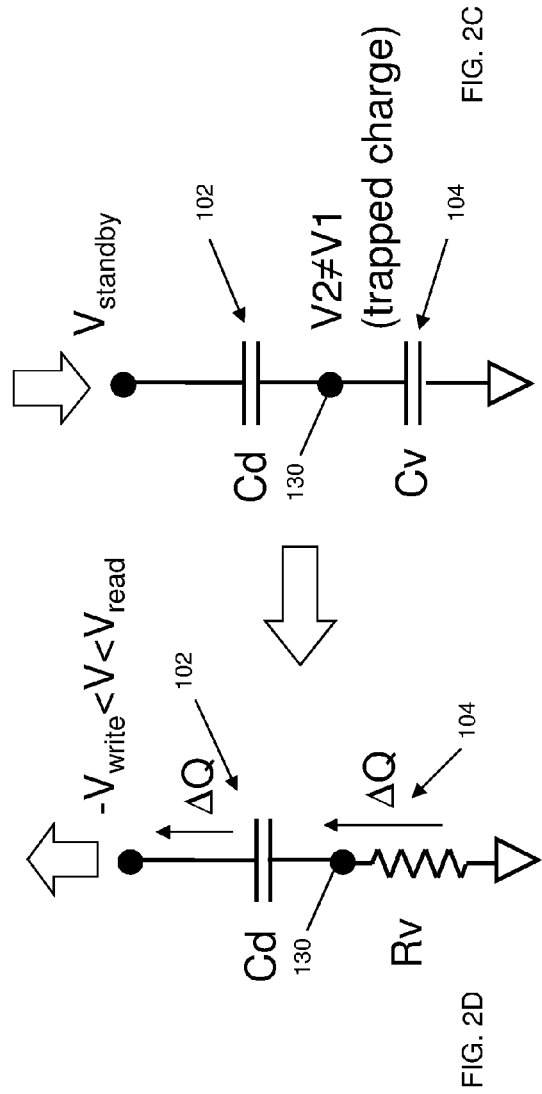

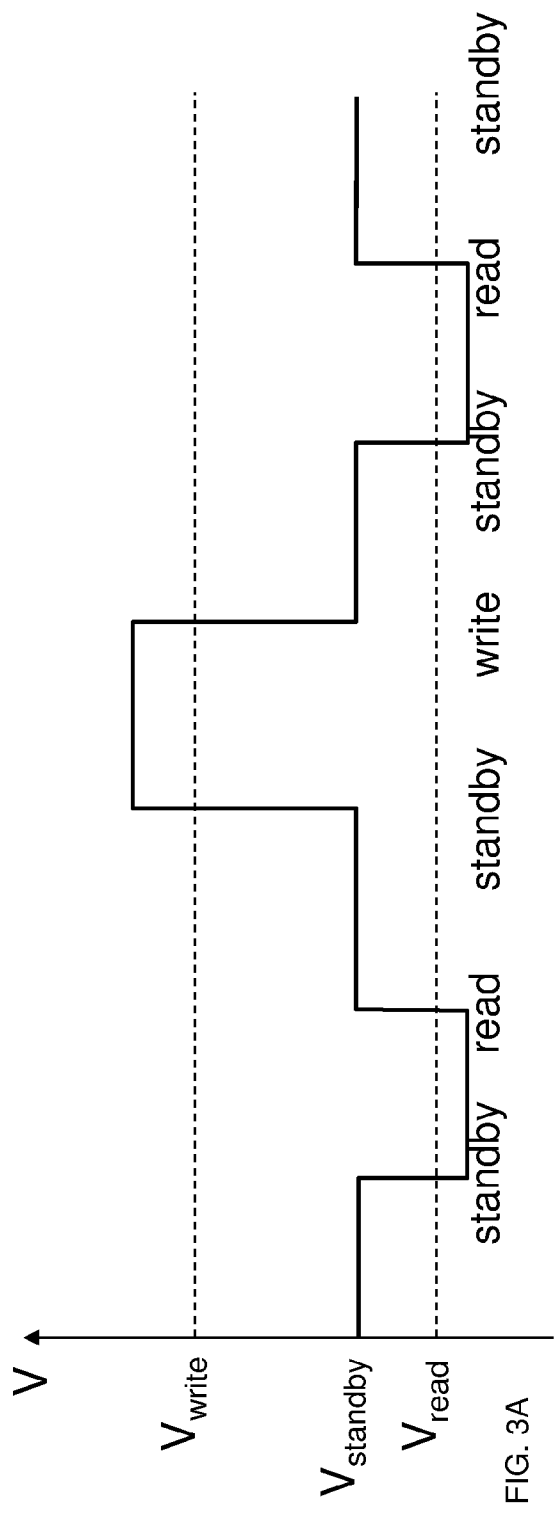
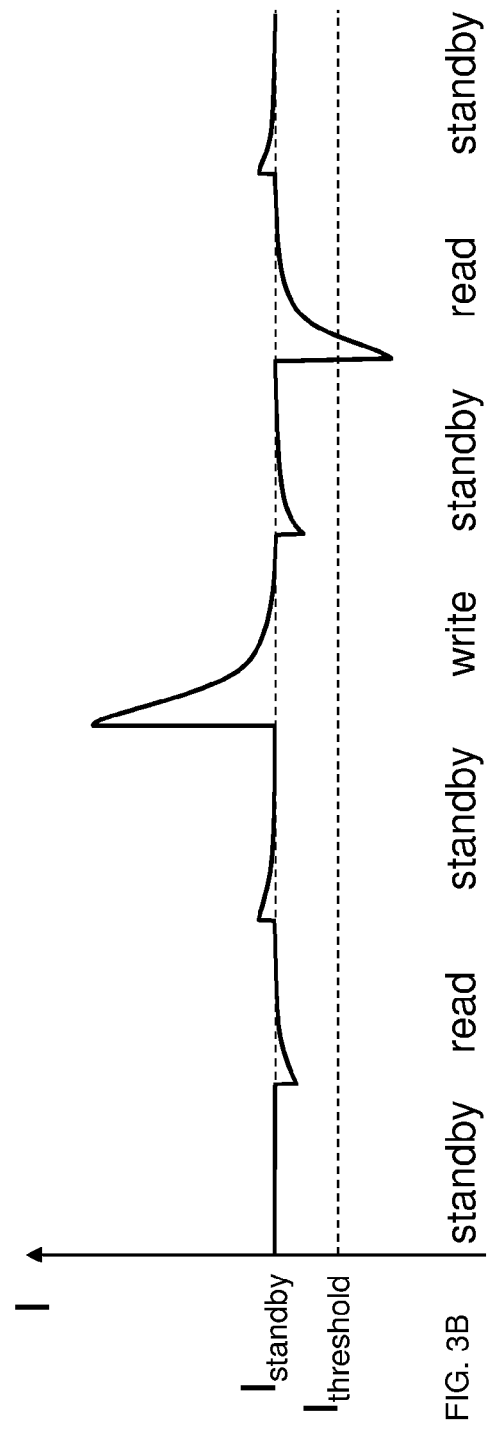
FIG. 3A
FIG. 3B

HIGH DENSITY MEMORY DEVICE

CROSS-REFERENCE TO RELATED APPLICATION

This application is a divisional of U.S. application Ser. No. 12/729,856 (Barwicz, et al.), filed on Mar. 23, 2010 the contents of which are incorporated herein by reference in their entirety.

BACKGROUND

Electronic memory is used in all modern electronics such as computers mobile phones, digital radios, and televisions. It is also used in modern cars, boats, aircraft and many appliances such as microwave ovens. Electronic memory is often referred to as random access memory (RAM) as it allows stored data to be accessed in any order. This is different from optical and magnetic disc memory where the readout mechanism needs to be positioned on the physical location where the stored data is located resulting in a variable access time to a given data depending on the previous data that was accessed.

In RAM, the access time is the same for all data, which is a key advantage. A few examples of common electrical memories are dynamic RAM (DRAM), static RAM (SRAM), and flash memory. Electronic memory usually takes the form of integrated circuits.

SUMMARY

According to an embodiment of the present invention, a method of operating a memory device having a dielectric material layer, a transition metal oxide layer and a set of electrodes each formed over a substrate is provided. The method includes applying a voltage across the set of electrodes producing an electric field across the transition metal oxide layer enabling the transition metal oxide layer to undergo a metal-insulation transition (MIT) to perform a read or write operation on memory device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A-2D are schematic diagrams illustrating the operation of the high-density memory device in accordance with one exemplary embodiment of the present invention;

FIG. 3 is an exemplary graph illustrating a read/write/read cycle of the memory device in accordance with one exemplary embodiment of the present invention.

DETAILED DESCRIPTION

Exemplary embodiments of the present invention provide a very high-density memory device and methods of forming or manufacturing the same using a material having reversible, electric-field induced metal-insulator transition (MIT). The memory device relies upon field dependent conductivity effects in an oxide material (e.g., vanadium or $VO_2$) with the oxide material switching back and forth between an insulating state and a metallic/conducting state as the electric field within it changes. Exemplary embodiments of the memory device described herein is based on the observation that the oxide of a transition metal, such as, for example, vanadium, undergoes a transition between a conducting state to an insulating state, better known as a MIT, when the electric field across it that causes the transition exceeds a predetermined value or threshold value. The inherent properties of the oxide material are used to fabricate a high density micro-scale memory device with read/write operations.

By incorporating this oxide material in a capacitor with a dielectric material and applying a suitable voltage sequence for changing the electric field across the transition metal, the transition metal will switch between insulating and conductive states forming a memory device capable of performing read and write operations. This structure opens up the possibility of a high density memory device that can be built or fabricated in nano-scale using standard semiconductor processing techniques, and incorporated in standard semiconductor designs.

Figure 1:
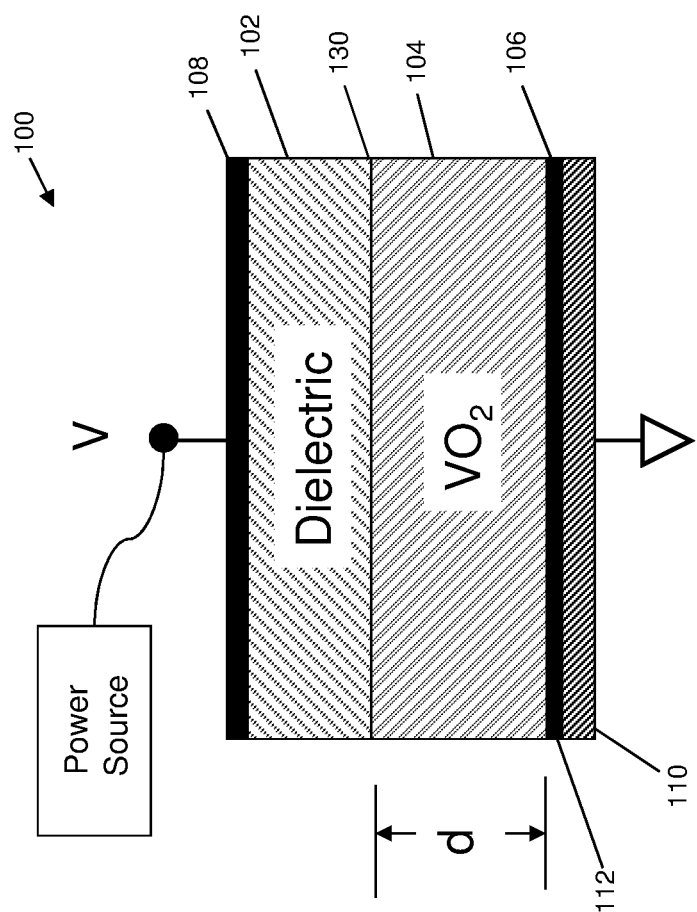
FIG. 1A is a schematic cross-sectional view of a high-density memory device in accordance with one exemplary embodiment of the present invention.

FIG. 1 is a cross-sectional view of the basic elements of a high density memory device/structure 100 in accordance with one exemplary embodiment. The structure 100 described herein can be part of the design for an integrated micro-scale circuit chip. The structure includes a dielectric layer 102 and transition metal oxide layer or oxide layer 104 placed between a set of electrodes, including a first electrode 106 and a second electrode 106 generally, forming a capacitor-like structure. The dielectric layer 102 and the oxide layer 104 are formed over a substrate generally indicated by substrate 110.

The first electrode 106 is disposed on an upper surface 112 of the substrate 110. In accordance with one embodiment, the first electrode 106 is formed directly on the substrate 110. It is contemplated other intermediary layers may be formed between the first electrode 106 and the substrate 110, such as, for example a buffer layer (not shown), to buffer a lattice mismatch between the substrate 110 and the first electrode 106.

The substrate 110 can be any material upon which semiconductor devices are fabricated and can be of any thickness, such as, for example, sapphire ($Al_2O_3$) or silicon (Si). It will be apparent that the substrate 110 can be made of a material other than the aforementioned materials. The first and second electrodes 106, 108 can be formed of at least one or more metals, metal alloys or a combination thereof. For example, copper, tungsten or aluminum can be used as candidates for the conductors. The first and second electrodes 106, 108 can also be formed of silicide (e.g., nickel silicide or platinum silicide) or a highly doped semiconductor, such as highly doped silicon.

The oxide layer 104 is formed over first electrode 106 using conventional or later developed semiconductor fabrication techniques. In one embodiment, the oxide layer 104 is in contact with the first electrode 106. In other embodiments, one or more intermediary layers (not shown) are disposed between the oxide layer and the first electrode 106. The oxide layer 104 is made up of a transition metal oxide, such as, vanadium dioxide, $VO_2$, as shown in FIG. 1. Of course the oxide layer 104 can be made of one or more transition metal oxide materials with the property of undergoing a metal-insulator transition dependent on electric field and should not be limited to the example shown herein. The oxide layer 104 has a thickness (d), which can be any value depending on the application. For example, the oxide layer can have a thickness range of about 1 to about 1000 nanometers (nm). The oxide layer 104 has inherent properties that enable the oxide material to transition between an insulating state to a conducting state, back to an insulating state and back to a conducting state, and so forth depending on the induced electric field present across the oxide layer 104. This phenomenon will be described in more detail below.

In accordance with one exemplary embodiment, the dielectric layer 102 is formed by depositing dielectric material on the oxide layer 104 using conventional or later developed semiconductor fabrication techniques. As such, the dielectric layer is in contact with the oxide layer 104 as shown. In alternative embodiments, another electrode or one or more intermediary layers (not shown) are formed between the dielectric layer 102 and the oxide layer 104. Thus, the configuration shown in FIG. 1 should not be limiting.

The dielectric layer 102 can be made up of one or more dielectric materials. Candidates for dielectric materials include silicon oxide, silicon dioxide, organosilicate glass, or hafnium containing oxides. Of course, other dielectric materials can be used in other exemplary embodiments of the invention. In this example, silicon dioxide ($SiO_2$) is used. The dielectric layer 102 can be of any thickness or diameter depending on the application and should not be limited to the configuration shown herein. For example, the dielectric layer can be in a thickness range of about 0.1 to about 100 nm. The second electrode 106 is disposed over the dielectric layer 102. In one embodiment, second electrode 106 is in contact with dielectric layer 102. In other embodiments, one or more intermediary layers (not shown) are formed between the second electrode 106 and the non-zero resistance layer.

A power source 120 electrically coupled to the electrodes is configured to apply a voltage, denoted as (V), across the first and second electrode 106, 108. The power source 120 can be any type of power source (e.g., battery, DC voltage, etc.) or any device for inducing and varying an electric field across the oxide layer 104.

FIGS. 2A-2D are electronic schematics illustrating the write/read cycle of the memory device 100 based on the properties of the oxide layer 104 according to one embodiment. As shown, the capacitances of the dielectric layer 102 and the oxide layer 104 are denoted as $C_d$ and $C_v$, respectively. The resistance of the oxide layer 104 when the oxide layer is in its conducting state is denoted as $R_v$. As shown, the oxide layer 104 generally acts as a capacitor in the resistive state and generally acts as a resistor in the conductive state.

In operation, a standby voltage ($V_{standby}$) is applied across the electrodes 106, 108. The voltage is divided according to the capacitances of the two layers, the dielectric layer 102 and the oxide layer 104, to produce an intermediary voltage ($V_1$) at an interface 130 between the dielectric layer 102 and the oxide layer 104. The standby voltage ($V_{standby}$) is below a given voltage range making the intermediary voltage (V1) too small to induce a change in phase in the oxide layer 104, which serves as a capacitor when the applied voltage is below the given voltage range as shown in FIG. 2A. An electric field is induced across the oxide layer 104 generally equal to the intermediary voltage divided by the thickness of the oxide layer 104 or $V_1/d$. The voltage can be raised sufficiently high such that the electric field across the oxide layer 104 exceeds a predetermined threshold value, which can be varied by inherent material properties of the oxide layer 104, enabling the oxide layer 104 to undergo a MIT. As a result, charge moves to the oxide/dielectric interface 103 corresponding to a write operation or data being written into the device. At this time, the total capacitance of the structure is increased. In this case, the oxide layer 104 transitions from serving as capacitor to serving as a resistor as illustrated in FIG. 2B. Specifically, when the electric field across the oxide layer exceeds the predetermined threshold value by applying a voltage greater than a predetermined write voltage or $V > V_{write}$ (e.g., from about 0.05 V to 100 V), the oxide layer 104 transitions from an insulating state to a conducting state. This performs a write operation by allowing charges to accumulate at the oxide/dielectric interface. The accumulation of the charges will reduce the potential drop across the oxide. At a given level of charge accumulation (depends on actual circuit used) the potential drop across the oxide will not be sufficient to sustain the oxide in a conductive state. Thus, the oxide will return to an insulating state despite $V > V_{write}$. The result will be the trapping of charges at the oxide/dielectric interface. When the applied voltage is returned to $V_{standby}$, the oxide layer 104 will remain in its insulating state where the oxide layer 104 serves as a capacitor trapping charge at the oxide/dielectric interface 103 as shown in FIG. 2C. This trapped charge modifies the potential at the interface 103 to another intermediary voltage ($V_2$), which is not equal to $V_1$, resulting in an alteration of the applied voltage required for a subsequent MIT. The amount of trapped charge is a function of the resistance $R_v$, capacitance $C_d$ and of the power source applying the voltage $V > V_{write}$. The larger the capacitance $C_d$ and the smaller the resistance $R_v$, the larger the trapped charge. The capacity of the power source to supply charge may also influence the amount of trapped charge.

When charge is trapped in the interface 103, adjusting the voltage between a predetermined read voltage range $(-V_{write} < V < V_{read})$ (e.g., with a magnitude of about 0.025 to 100 V and with opposite sign to the write voltage) will induce a subsequent MIT and release the trapped charge. As a result, charge moves in the opposite direction from the oxide/dielectric interface 103 corresponding to a read operation or data being read from the device as shown in FIG. 2D. This read voltage is not sufficient, however, to induce a MIT if charge is not trapped. If charge is trapped, a voltage between the predetermined read voltage range $(-V_{write} < V < V_{read})$ would be sufficient to induce a MIT and release the trapped charge.

FIG. 3A illustrates a graph of the read/write cycle of the memory device with respect to an exemplary applied voltage sequence. As shown, a write operation is performed only when the voltage applied is above the predetermined write voltage or $V > V_{write}$. A read operation is performed when the voltage applied is between the predetermined read voltage range $(-V_{write} < V < V_{read})$. The read operation results in a notable current spike only if it is performed after a write operation has been performed. The resulting current of the applied voltage sequence of FIG. 3A is shown in FIG. 3B. As shown, a large current is only seen when a MIT is induced. The magnitude of the current spike resulting from a MIT is enhanced with a large $C_d$ and a small $C_v$. The current level detected at the read operation indicates in which state the memory was before the read operation. If charge was trapped at the dielectric/oxide interface via a write operation, a much larger current spike will be detected. A current threshold indicated by $I_{threshold}$ in FIG. 3B can be established for a given implementation of the structure and used to differentiate between the two possible memory states at readout.

Figure 4A:
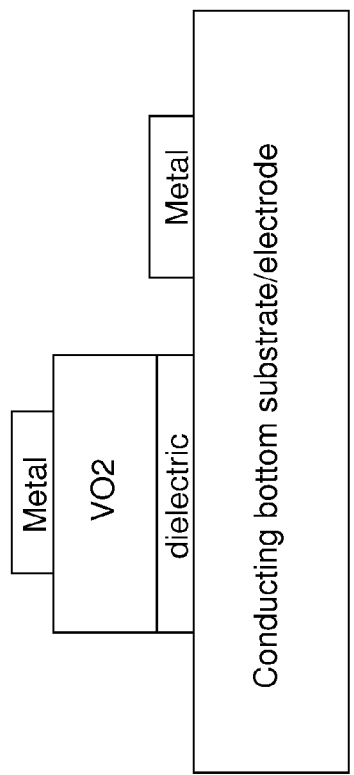
FIGS. 4A and 4B illustrate two exemplary physical implementations of the memory device in accordance with one exemplary embodiment of the present invention.
Figure 4B:
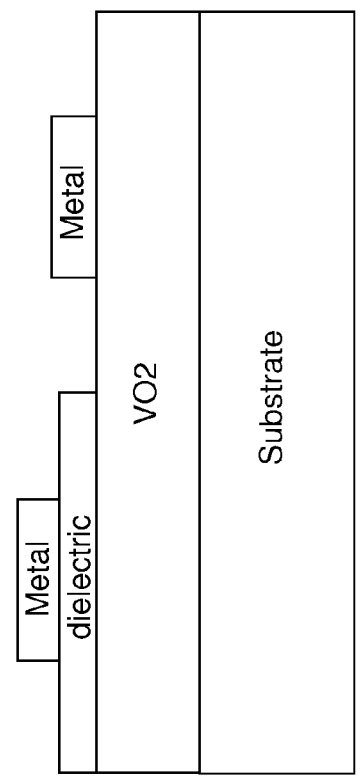

FIGS. 4A and 4B illustrate exemplary physical implementations of the memory device 100. Although the various embodiments describe the dielectric layer 102 being disposed over the oxide layer 104, other embodiments include the oxide layer 104 being disposed over the dielectric layer 102 as shown in FIG. 4A. The electrodes 106, 108 are illustrated here as metal elements being disposed in various locations above the substrate. The skilled artisan can appreciate that the electrodes can be positioned in various locations above the substrate and should not be limited to the configurations shown herein. In one embodiment, the lateral spacing between the electrodes is in the range of 10 nm to 10 μm.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of operating a memory device having a dielectric material layer, a transition metal oxide layer, a first electrodes disposed directly on top of and in contact with a substrate and a second electrode formed directly on top of and in contact with the dielectric material layer, comprising:
    applying a voltage across the set of electrodes producing an electric field across the transition metal oxide layer enabling the transition metal oxide layer to undergo a metal-insulation transition (MIT) to perform a read or write operation on memory device,
    wherein the dielectric material layer is formed directly on top of an in contact with the transition metal oxide layer and is disposed between the transition metal oxide layer and the second electrode.

2. The method as of claim 1, wherein the transition metal oxide layer transitions from an insulating state to a conducting state when the voltage applied exceeds a predetermined write voltage enabling the write operation on the memory device.

3. The method as of claim 2, wherein the transition metal oxide layer transitioning from the insulating state to conducting state results in charge being trapped at an interface between the transition metal oxide layer and the dielectric layer altering the voltage required for inducing a subsequent MIT in the transition metal oxide layer.

4. The method as of claim 3, wherein inducing the subsequent MIT in the transition metal oxide layer includes releasing trapped charge at the interface by adjusting the voltage applied to a voltage level between a predetermined read voltage range.

5. The method as of claim 4, wherein adjusting the voltage applied to the voltage level between the predetermined read voltage range enables the read operation in the memory device.

6. The method of claim 1, wherein the transition metal oxide layer is formed of a vanadium dioxide material.

7. The method of claim 1, wherein the dielectric layer comprises silicon oxide.

8. The method of claim 1, wherein the first and second of electrodes are made of a metal, silicide, a highly doped semiconductor or a combination thereof.

9. The method of claim 1, wherein the dielectric layer comprises silicon dioxide.

10. The method of claim 1, wherein the dielectric layer comprises organosilicate glass.

11. The method of claim 1, wherein the dielectric layer comprises a hafnium containing oxide.

* * * * *